United States Patent
Reichert

(10) Patent No.: US 10,842,032 B2
(45) Date of Patent: Nov. 17, 2020

(54) COMBINATION OF A PLUG AND A COVER

(71) Applicant: CPT GROUP GMBH, Hannover (DE)

(72) Inventor: Martin Reichert, Wenzenbach (DE)

(73) Assignee: CPT Group GmbH, Hannover (DE)

( * ) Notice: Subject to any disclaimer, the term of this patent is extended or adjusted under 35 U.S.C. 154(b) by 0 days.

(21) Appl. No.: 16/341,995

(22) PCT Filed: Oct. 4, 2017

(86) PCT No.: PCT/EP2017/075162
§ 371 (c)(1),
(2) Date: Apr. 15, 2019

(87) PCT Pub. No.: WO2018/069100
PCT Pub. Date: Apr. 19, 2018

(65) Prior Publication Data
US 2019/0254184 A1 Aug. 15, 2019

(30) Foreign Application Priority Data
Oct. 13, 2016 (DE) .......................... 10 2016 220 022

(51) Int. Cl.
*H05K 5/00* (2006.01)

(52) U.S. Cl.
CPC ......... *H05K 5/0052* (2013.01); *H05K 5/0069* (2013.01)

(58) Field of Classification Search
CPC ........ H02G 3/14; H02G 3/081; H02G 15/113; H01R 13/506; H05K 5/0052; H05K 5/0069
See application file for complete search history.

(56) References Cited

U.S. PATENT DOCUMENTS 3,335,900 A * 8/1967 Czeslaw Mackiewicz ................. H02G 3/14
220/242
6,664,472 B2 * 12/2003 Saneto ................... H02G 3/081
174/66

(Continued)

FOREIGN PATENT DOCUMENTS

CN 102316691 A 1/2012
DE 10045728 A1 3/2001

(Continued)

*Primary Examiner* — James Wu
(74) *Attorney, Agent, or Firm* — Laurence A. Greenberg; Werner H. Stemer; Ralph E. Locher

(57) ABSTRACT

A combination of a plug and a cover. The plug has a plug housing and a plug longitudinal edge which extends along a plug longitudinal direction and on which at least one insertion receptacle is arranged which borders a receiving opening. The cover has a cover longitudinal edge in the cover longitudinal direction and on which at least one insertion element for insertion into the receiving opening is arranged. The insertion element has a shaft and at least one holding projection which proceeds from the shaft. The insertion receptacle has two wall regions which delimit the receiving opening on two opposite sides. In a non-assembled state of the plug and the cover, in at least one perpendicular cross-sectional plane, an opening width between the two wall regions is smaller than a width of the insertion element in a cross-sectional plane which is perpendicular in relation to the element plug-in direction.

19 Claims, 6 Drawing Sheets

(56) References Cited

U.S. PATENT DOCUMENTS

| | | | |
|---|---|---|---|
| 6,707,678 B2 | 3/2004 | Kobayashi et al. | |
| 6,773,272 B2 * | 8/2004 | Koehler | H01R 12/724 439/620.01 |
| 6,905,073 B2 | 6/2005 | Gerrits et al. | |
| 8,648,264 B2 * | 2/2014 | Masumoto | H02G 3/0675 174/50 |
| 9,093,776 B2 * | 7/2015 | Yamanaka | A47B 95/008 361/829 |
| 2008/0205029 A1 * | 8/2008 | Fabrizi | A47B 95/008 361/829 |
| 2011/0198120 A1 * | 8/2011 | Richter | H01R 13/5202 174/548 |
| 2016/0254612 A1 | 9/2016 | Andrei et al. | |

FOREIGN PATENT DOCUMENTS

| | | |
|---|---|---|
| DE | 69737447 T2 | 11/2007 |
| DE | 102008054384 A1 | 6/2010 |
| EP | 2034811 A1 | 3/2009 |
| WO | 2015018591 A1 | 2/2015 |

\* cited by examiner

COMBINATION OF A PLUG AND A COVER

TECHNICAL FIELD

The invention relates to a combination of a plug and a cover. The plug has a plug housing, which has a plug main body, and contact pins, which protrude beyond an end face of the plug main body. The plug housing extends in a plug longitudinal direction and in a plug transverse direction, which is perpendicular to said plug longitudinal direction, and has a plug longitudinal edge which extends along the plug longitudinal direction and on which or adjacent to which, on the plug housing, at least one insertion receptacle is arranged. The insertion receptacle borders a receiving opening. The cover extends in a cover longitudinal direction and in a cover transverse direction, which is perpendicular to said cover longitudinal direction, and has a cover longitudinal edge which extends along the cover longitudinal direction and on which or adjacent to which, on the cover, at least one insertion element for insertion into the receiving opening is arranged, which insertion element extends transversely, in particular perpendicularly, in relation to the cover longitudinal direction and in relation to the cover transverse direction.

The plug is preferably a plug of an electronic control unit, in particular of a motor controller. The cover may be, for example, a sheet-metal cover. Sealing material, preferably curable sealing material, is preferably arranged between the cover longitudinal edge and the plug longitudinal edge for sealing purposes.

PRIOR ART

In conventional relatively large plugs of motor controllers, which plugs are connected to a sheet-metal cover of a controller housing in a sealing region, it is found to be disadvantageous that there is often no mechanical clamping between the plug and the sheet-metal cover over a relatively long distance there. Mechanical fastening between the plug and the cover with the aid of a screw arrangement is known from the prior art. However, a screw arrangement of this kind has an increased space requirement and cannot be used in the case of plugs with a narrow arrangement of a plurality of plug chambers. In addition, it is disadvantageous that a screw, that is to say an additional fastening part, and also an additional assembly step are required for the screw arrangement.

EP 2 034 811 A2 discloses a combination comprising a plug and a cover. In said document, the plug and the cover are adhesively bonded by means of a sealing compound. A strip-like insertion element 26 which is arranged on the cover engages into a groove which is formed on the plug, in order to establish an interlocking connection which acts parallel in relation to the cover plane.

DE 100 45 728 A1 likewise discloses a combination comprising a plug and a cover which is fastened to said plug by means of a sealing compound. A bead section 84 of the cover, which beat section runs in the cover longitudinal direction, engages into a channel section 31 in which sealing compound is located. This in turn creates only an interlocking connection in the direction parallel in relation to the cover plane. In addition, the plug can be screwed to a main body of a housing, and a cover can then be screwed onto the main body. As a result, assembly is complicated.

SUMMARY OF THE INVENTION

Against this background, the object of the invention is to advantageously develop a combination of the generic type of a plug and a cover, so that, in particular, individual or several of the abovementioned disadvantages can be largely or completely avoided.

This object is achieved by a combination of a plug and a cover, which combination exhibits the features of the independent patent claim. Advantageous refinements and developments of the combination can be gathered from the dependent patent claims, the following description and the drawings.

One aspect of the present disclosure discloses a combination—which is, in particular, an arrangement—of a plug and a cover exhibiting the features mentioned in the introductory part.

The plug is designed, in particular, to receive a mating plug in a plug-in direction. The plug longitudinal direction and the plug transverse direction are preferably perpendicular in relation to the plug-in direction and, in particular, also in relation to one another. In an expedient refinement, the dimension of the plug in the plug longitudinal direction is at least twice as large as in the plug transverse direction. The contact pins of the plug are preferably arranged in rows which run along the plug longitudinal direction, wherein the rows follow one another in the plug transverse direction. Here, the number of contact pins per row is preferably at least twice as high, in particular at least four times as high, as the number of rows. In a further refinement, the plug has a plurality of—in particular at least three—separate plug chambers which follow one another in the plug longitudinal direction.

The cover transverse direction is—at least in an assembled state of the plug and the cover—preferably parallel in relation to the plug-in direction of the plug. The cover longitudinal direction and the plug longitudinal direction are—at least in the assembled state—preferably parallel in relation to one another.

A further aspect discloses a housing for an electronic control unit comprising the arrangement of the plug and the cover. In particular, the housing is made up of the plug, the cover and at least one further housing part, for example a housing main body. A third aspect discloses an electronic control unit comprising the housing. A printed circuit board of the electronic control unit can expediently be accommodated in the housing. The plug is preferably fastened to the printed circuit board, in particular pressed with and/or soldered to said printed circuit board.

In the case of the combination according to the present disclosure, the insertion element has a shaft, which extends along an element plug-in direction of the insertion element, and at least one holding projection, which proceeds from the shaft in an element transverse direction which is perpendicular in relation to the element plug-in direction, the insertion receptacle has two wall regions which delimit the receiving opening, which extends along a receptacle plug-in direction of the insertion receptacle, on two opposite sides, and, in a non-assembled state of the plug and the cover, in at least one cross-sectional plane which is perpendicular in relation to the receptacle plug-in direction, an opening width between the two wall regions is smaller than a width of the insertion element in at least one cross-sectional plane which is perpendicular in relation to the element plug-in direction and runs through the holding projection.

In this case, the cross-sectional plane which is perpendicular in relation to the receptacle plug-in direction and the cross-sectional plane which is perpendicular in relation to the element plug-in direction and runs through the holding projection, which cross-sectional planes define said opening width or said width, in particular coincide in the assembled state, or the cross-sectional plane which is perpendicular in relation to the element plug-in direction and runs through the holding projection is, in the assembled state, arranged offset in the direction away from the cover longitudinal edge with respect to the cross-sectional plane which is perpendicular in relation to the receptacle plug-in direction.

This allows the formation of an interlocking and/or force-fitting mechanical fixing arrangement which acts between the insertion element and the insertion receptacle and which mechanically fixedly connects the plug housing and the cover to one another. In particular, preferably in conjunction with an interlocking holding connection, the cover and the plug housing can be mechanically fixed to one another by a type of stitching process. Projections in the form of hooks, in particular barbs, can preferably be formed laterally on the engagement element and hook-like recesses can preferably be formed on the wall regions, so that projections and recesses interact in an interlocking manner in the assembled state and as a result prevent separation of the cover and the plug housing from one another. With preference, sealing material, in particular curable sealing material, is arranged between the cover longitudinal edge and the plug longitudinal edge and, before complete curing of the sealing material, the cover is preferably mechanically fastened to the plug housing by means of the insertion elements and the insertion receptacles. Therefore, the mechanical fixing can take effect as early as during curing. Said mechanical fixing can advantageously be produced without separate connecting elements, such as screws or clips for example. An insertion element according to the invention can also be called a stitch pin. The mechanical fixing can advantageously already be produced during the course of pressing the cover against the plug housing, this pressing operation taking place in any case owing to the sealing material. Therefore, an additional process is not required for producing the mechanical fixing. A beading process which is known from the prior art in this region could very severely deform the blade strip if, as is frequently the case, the plug is highly elastic in the center. In the case of a combination according to the invention, the introduction of force for the mechanical fixing (the process could also be called a stitching process) can preferably be performed perpendicularly in relation to the sealing geometry, so that it subjects the plug housing only to slight loading. Mechanical fixing of the plug to the cover in this region is possible in all directions by means of insertion elements and insertion receptacles. In the case of a so-called "in-circuit test" which takes place during manufacture, the plug is subjected to severe loading by the pin contact-making operation and deformed. In the case of a combination according to the invention comprising a plug and a cover, sagging of the plug can be minimized by means of the mechanical fixing.

Terms such as "a" and "one" are not to be interpreted as numerical specifications, unless expressly stated otherwise. The element plug-in direction is a direction relating to the insertion element in which the insertion element can be moved relative to the insertion receptacle when inserted into the receiving opening. The receptacle plug-in direction is a direction relating to the insertion receptacle in which the insertion receptacle can be moved relative to the insertion element when the insertion element is inserted into the receiving opening.

There are numerous options for refining or modifying the combination in a preferred manner:

A respective insertion receptacle can be integrally formed on the plug housing, in particular on the plug main body, or attached to it. A respective insertion element can be integrally formed on the cover or attached to it.

As an alternative to or in combination with at least one insertion receptacle which borders a receiving opening being arranged on the or adjacent to the plug longitudinal edge and at least one insertion element for insertion into the receiving opening being arranged on the or adjacent to the cover longitudinal edge, it is possible for at least one insertion receptacle which borders a receiving opening to be arranged on the or adjacent to the cover longitudinal edge on the cover, for the receptacle plug-in direction of said insertion receptacle to be oriented transversely, in particular perpendicularly, in relation to the cover longitudinal direction and the cover transverse direction, and for at least one insertion element for insertion into the receiving opening to be arranged on the or adjacent to the plug longitudinal edge on the plug housing, the element plug-in direction of said insertion element extending along, in particular parallel in relation to, the plug transverse direction. It is also possible in this context for the insertion element to have a shaft, which extends along an element plug-in direction of the insertion element, and at least one holding projection, which proceeds from the shaft in an element transverse direction which is perpendicular in relation to the element plug-in direction, for the insertion receptacle to have two wall regions which delimit the receiving opening, which extends along the receptacle plug-in direction of the insertion receptacle, on two opposite sides, and, in a non-assembled state of the plug and the cover, in at least one cross-sectional plane which is perpendicular in relation to the receptacle plug-in direction, for an opening width between the two wall regions to be smaller than a width of the insertion element in at least one cross-sectional plane which is perpendicular in relation to the element plug-in direction and runs through the holding projection.

With preference, a cross-sectional plane which is spanned by an insertion mouth of the insertion opening extends in a plane which is perpendicular in relation to the plug transverse direction. The insertion element can preferably have, in cross-sectional planes which are perpendicular in relation to its longitudinal center axis, a rectangular, in particular flat, cross section. In cross-sectional planes which are perpendicular in relation to the longitudinal center axis of the insertion receptacle, the receiving opening can likewise have a rectangular, in particular flat, cross section which is matched, in particular, to a receptacle of the insertion element.

The cover may be a housing part of the housing, preferably a housing for accommodating a motor controller. In a use position of the housing, the cover can be arranged, for example, on the top side or on the bottom side or on a side which is situated between the top side and the bottom side.

With preference, the insertion element is inserted or can be inserted into the receiving opening, so that an interlocking connection, in particular an interlocking snap-action connection, which prevents the insertion element from being pulled out of the receiving opening is produced between the holding projection and at least one of the wall regions.

A preferred development is regarded as being one in which the insertion element has a pair of two holding projections next to one another which face outward from the shaft to opposite sides or the insertion element has several pairs of in each case two holding projections next to one another which face outward from the shaft to opposite sides. It is possible, in a cross-sectional plane which runs parallel in relation to the element plug-in direction, for each holding projection to have a holding face which runs transversely, in particular perpendicularly, in relation to the element plug-in direction, and a side face, which adjoins said holding face at an angle and which, proceeding from the holding face, runs, in particular in a straight line or in a rounded manner, in the direction of a free longitudinal end of the insertion element and in the direction of a longitudinal center axis LE of the insertion element. The longitudinal center axis of the insertion element and the element plug-in direction preferably run parallel in relation to one another.

When their holding face runs perpendicular in relation to the element plug-in direction, the projections can preferably have a hook-like cross section, in particular in the form of a right-angled triangle. When the holding face, proceeding from the shaft, runs laterally outward and in the process in the direction away from a free longitudinal end of the shaft, the projections can preferably be designed as barbs.

It is regarded to be an expedient development for the two holding projections of a respective pair to be designed axially symmetrically in relation to one another with respect to the longitudinal center axis of the insertion element. It is possible, in the case of a first pair which is formed from two holding projections and is arranged further away from a free longitudinal end of the insertion element than a second pair comprising two holding projections, for the holding faces to extend outward until they are further away from the longitudinal center axis of the insertion element than the holding faces of the holding projections of the second pair. The insertion element can therefore have, in a cross-sectional plane which leads through its longitudinal center axis, an outer contour which resembles the silhouette of a Christmas tree.

With respect to the wall regions, preference is given to in each case one recess or a plurality of recesses being formed in the two wall regions which border the receiving opening, in particular even before insertion of an insertion element into the receiving opening, wherein, in a cross-sectional plane which runs parallel in relation to the receptacle plug-in direction, the recess or each recess has a supporting face which extends transversely, in particular perpendicularly, in relation to the receptacle plug-in direction and a side face which adjoins said supporting face at an angle and which, proceeding from the supporting face, runs, in particular in a straight line or in a rounded manner, in the direction away from an insertion mouth of the receiving opening and in the direction of a longitudinal center axis of the receiving opening. As an alternative, it would be possible for the recess or the recesses to first be formed in the wall regions as a consequence of the insertion of an insertion element, in particular as a result of elastic and/or plastic deformation of the respective wall region. The longitudinal center axis of the receiving opening and the receptacle plug-in direction preferably run parallel in relation to one another.

It is possible for the insertion receptacle to have a pair of two recesses next to one another which extend outward in opposite lateral directions, or for the insertion receptacle to have a plurality of pairs of in each case two recesses next to one another which extend outward in opposite directions.

With preference, the two recesses of a respective pair are designed axially symmetrically in relation to one another with respect to the longitudinal center axis of the insertion receptacle. Particularly in conjunction with the feature that the insertion element has a respectively different maximum width in the region of two pairs of its holding projections, it is preferred, in the case of at least one pair which is formed from two recesses, for the clear opening width, which is determined by the two supporting faces of said pair, to be smaller than, in the case of at least one pair which is formed from two holding projections, the width of the insertion element which is determined by the two holding faces of said pair.

In order to achieve an elastic snap-action connection which acts in an interlocking manner, it is preferred for the insertion element to be adapted such that it is elastically deformed when it is inserted into the receiving opening when, based on a non-assembled starting state of the plug and the cover, two holding projections of a pair, in the case of which a width of the insertion element is greater than a clear opening width of the receiving opening which is associated with a pair of recesses, are moved through the cross section of the receiving opening with this clear width, so that a reduction in this width results.

The elastic deformation returns when the two holding projections which determine said width have crossed the comparatively narrower section of the receiving opening in question. As a result of the elastic return deformation, a lateral overlap between in each case one holding face and in each case one supporting face is produced in the direction perpendicular in relation to the longitudinal axes of the insertion element and the insertion receptacle, so that an interlocking connection results, this preventing the insertion element from being pulled out of the insertion receptacle. The insertion element can be adapted in said manner, for example, by suitable dimensioning and/or selection of the material and/or matching of the material to the material of the wall regions.

As an alternative or in combination, it is possible for a wall region or the two wall regions of the insertion receptacle to be adapted such that it is or they are elastically deformed and/or shifted when the insertion element is inserted into the receiving opening when, based on a non-assembled starting state of the plug and the cover, two holding projections of a pair, in the case of which a width of the insertion element is greater than a clear opening width of the receiving opening which is associated with a pair of recesses, are moved through the cross section of the receiving opening with this clear width, so that an increase in this clear opening width results.

In other words, two holding projections—in particular two holding projections of one of the pairs of holding projections—engage into an associated pair of recesses in an assembled state of the plug and the cover. In this case, a width of the insertion element in the region of the two holding projections is expediently greater than a clear opening width of the receiving opening in a region which immediately precedes the pair of recesses. For example, the pair of recesses is delimited by opposite prongs of the wall region of the receiving opening which are passed by the holding projections during insertion.

The distance between the prongs then defines the above-mentioned clear opening width. The insertion element can expediently be dimensioned, designed and arranged in such a way that the two holding projections of the pair, when the insertion element is inserted into the receiving opening, are moved through the cross section of the receiving opening with this clear opening width and are elastically deformed, so that a reduction in this width of the insertion element results. As an alternative or in addition, at least one of the wall regions of the insertion receptacle—in particular the opposite prongs—can be dimensioned, designed and arranged in such a way that it is elastically deformed and/or shifted, so that an increase in the size of this clear opening width results when the two holding projections of the pair, when the insertion element is inserted into the receiving opening, are moved through the cross section of the receiving opening with this clear opening width.

It is regarded to be an expedient development, in a cross-sectional plane which is parallel in relation to the element plug-in direction, for two recesses which are formed next to one another to each have an outer contour which corresponds to the outer contour of two holding projections, which are arranged next to one another, in a cross-sectional plane which is parallel in relation to the receptacle plug-in direction. It is regarded as being advantageous, in the case of an orientation of the cover relative to the plug which is suitable, in particular intended, for fitting the cover to the plug, for the insertion element to be in alignment with the receiving opening.

Particularly in the case of plugs and covers which are comparatively large in their respective longitudinal direction, it is advisable for a plurality of insertion elements which are at a distance from one another in the cover longitudinal direction to be arranged on the or adjacent to the cover longitudinal edge, and for a plurality of insertion receptacles which are at a distance from one another in the plug longitudinal direction to be arranged on the or adjacent to the plug longitudinal edge, wherein, in the case of an orientation of the cover relative to the plug which is suitable, in particular intended, for fitting the cover to the plug, in each case one insertion element is in alignment with in each case one receiving opening. In this case, each insertion element and each insertion receptacle is preferably designed in accordance with at least one of the refinements or developments disclosed in the present case.

As a result, the maximum distance between adjacent plug-in connections as viewed in the respective longitudinal direction can be limited and the stability of the combination can be improved in this way. A preferred refinement is regarded as being one in which, in the case of insertion elements and insertion receptacles which are associated with them for fitting purposes and which are arranged comparatively further outward in the plug longitudinal direction and, respectively, in the cover longitudinal direction, the holding projections and recesses are matched to one another such that, in the assembled state, a comparatively smaller overlap between supporting faces and holding faces results than in the case of at least one insertion element and one insertion receptacle which is associated with said insertion element for fitting purposes which are arranged comparatively further inward in the plug longitudinal direction and, respectively, in the cover longitudinal direction, wherein provision is made, in particular, in the assembled state of the cover and the plug, for an overlap between at least one holding face and one supporting face to be produced only on in each case one side of the longitudinal center axis of the insertion element on the two in each case outermost insertion elements and insertion receptacles. A further outer arrangement is understood to mean an arrangement which is closer to a side edge, and a further inner arrangement is understood to mean an arrangement which is situated closer to a center of the cover or of the plug. Owing to these features, it is advantageously possible for the tolerances to not be so strict.

In a preferred refinement, provision is made for the plug to have a plurality of plug-in frames, each plug-in frame of which is attached to the end face of the plug main body and/or projects beyond the end face of the plug main body, wherein each plug-in frame borders a plug chamber into which a plurality of contact pins extend, and for an insertion receptacle to be arranged between two adjacent plug-in frames as viewed in the plug longitudinal direction. The number and arrangement of the plug-in systems can be selected depending on the number of plug-in frames or plug chambers present and depending on the configuration of the plug-in system having an insertion element and an insertion receptacle.

With preference, sealing material, preferably curable or cured sealing material, is arranged between the cover longitudinal edge and the plug longitudinal edge for sealing purposes. Provision is preferably made for the plug to be the plug of an electronic control unit, in particular of a motor controller, and/or for the cover to be a sheet-metal cover, and/or for the cover to be a cover of a housing for an electronic control unit, in particular for a motor controller or a base of a housing for an electronic control unit, in particular for a motor controller.

BRIEF DESCRIPTION OF THE DRAWINGS

The invention will be described in more detail below with reference to the appended figures which show a preferred exemplary embodiment. In detail.

DESCRIPTION OF THE EMBODIMENTS

Figure 1:
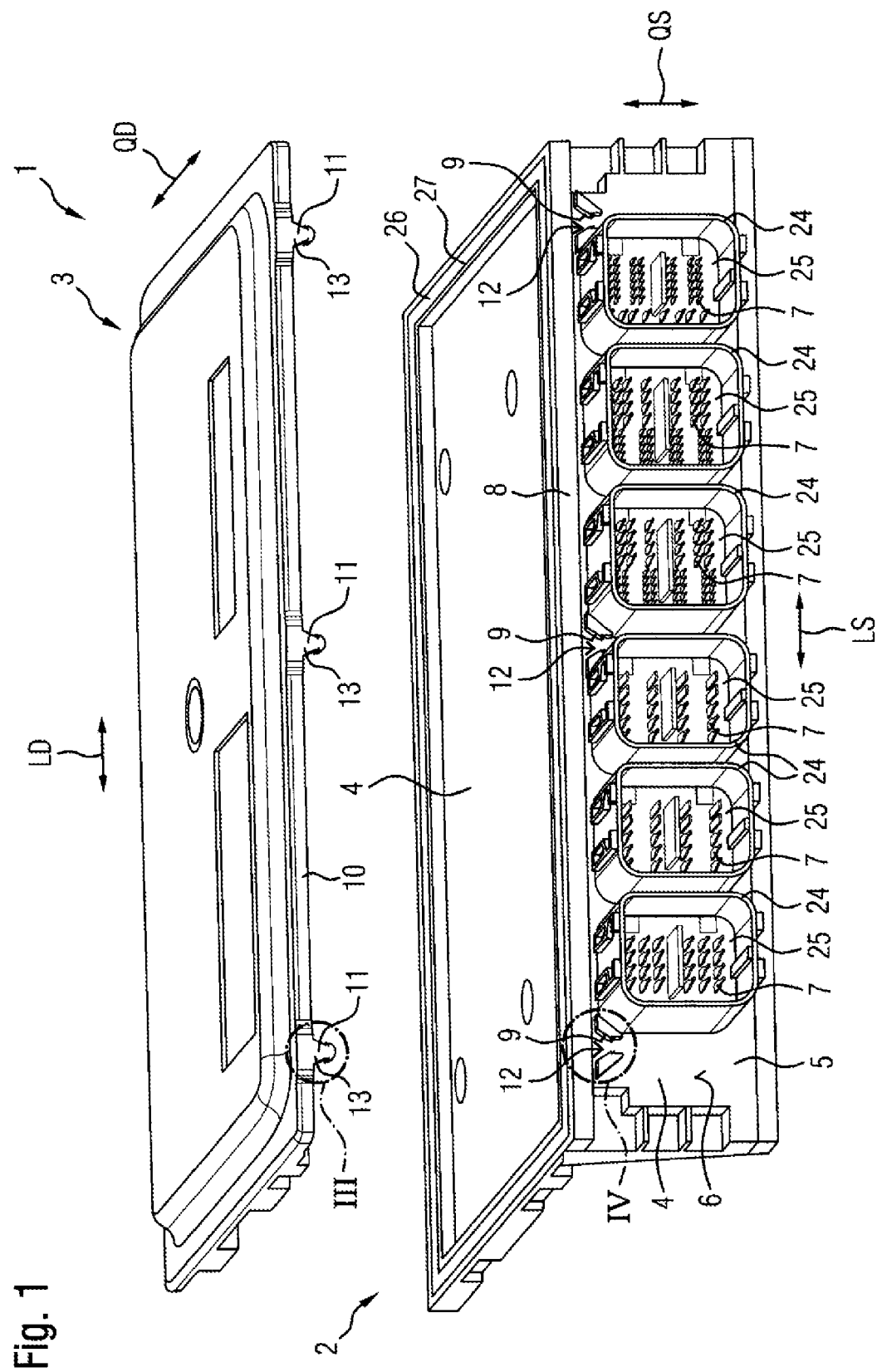
FIG. 1 shows a perspective view of a combination according to the invention of a plug and a cover according to one preferred exemplary embodiment, before said plug and cover are fitted to one another.

A combination 1 according to the invention and according to a first exemplary embodiment will be presented with reference to FIGS. 1 to 5. Said combination has a plug 2 and a cover 3 which is produced from sheet metal in the example.

The plug 2 has a plug housing 4 which has a plug main body 5 with a planar end face 6. In addition, the plug 2 has contact pins 7 which extend beyond the end face 6 at the front and in this way define a plug-in direction in which a mating plug (not illustrated in the figures) can be plugged onto the contact pins 7.

The plug housing 4 extends perpendicularly in relation to the plug-in direction in a plug longitudinal direction LS and in a plug transverse direction QS which is perpendicular in relation to the plug longitudinal direction LS and in relation to the plug-in direction. Said plug housing has a plug longitudinal edge 8 which extends along the plug longitudinal direction LS. In the selected example, three insertion receptacles 9 which are at a distance from one another in the plug longitudinal direction LS are arranged on said plug longitudinal edge.

The cover 3 extends, in its cover plane—that is to say in its main plane of extent —, in a cover longitudinal direction LD and in a cover transverse direction QD which is perpendicular to said cover longitudinal direction. The cover plane is spanned, in particular, by the two directions which are perpendicular in relation to one another and in which the cover has its largest dimensions, wherein these directions correspond, in particular, to the cover longitudinal direction LD and to the cover transverse direction QD. The cover longitudinal direction LD and the plug longitudinal direction LS are parallel in relation to one another in the present exemplary embodiment.

The cover 3 has a cover longitudinal edge 10 which extends along the cover longitudinal direction LD. In the example, three insertion elements 11 which are at a distance from one another in the cover longitudinal direction LD are integrally formed on said cover longitudinal edge. Each insertion element 11, in terms of its position with respect to said longitudinal directions, is associated with one of the insertion receptacles 9 for insertion into the receiving opening 12 thereof.

The insertion elements 11 extend perpendicularly in relation to the cover longitudinal direction LD and perpendicularly in relation to the cover transverse direction QD, that is to say away from the cover longitudinal edge 10 perpendicularly in relation to the cover plane. Each insertion element 11 is integrally formed on the cover longitudinal edge 10 by means of a shaft 13. As shown on an enlarged scale in FIG. 3, the shaft 13 extends along a longitudinal center axis LE which extends perpendicularly in relation to a plane which is spanned by the cover longitudinal direction LD and the cover transverse direction QD. The longitudinal center axis LE extends parallel in relation to an element plug-in direction SE and perpendicularly in relation to an element transverse direction QE which runs transversely in relation to said element plug-in direction. The element plug-in direction SE is oriented, as illustrated by the single-headed directional arrow, in the direction into which the insertion element 11 can be inserted into the insertion receptacle 9 associated with it (cf. FIG. 4) for fixing purposes. The element transverse direction QE is, as illustrated by the double-headed arrow, an absolute figure. In the example, a total of four holding projections 14 are integrally formed on the shaft 13. The design of the insertion element 11 is flat and planar overall. The insertion element 11 can be called a plug-in tongue in this respect. Each holding projection 14 proceeds from the shaft 13 in a direction which is perpendicular in relation to the longitudinal center axis LE, that is to say along the element transverse direction QE, that is to say each said holding projection projects laterally outward beyond the shaft 13 in the element transverse direction QE.

Figure 3:
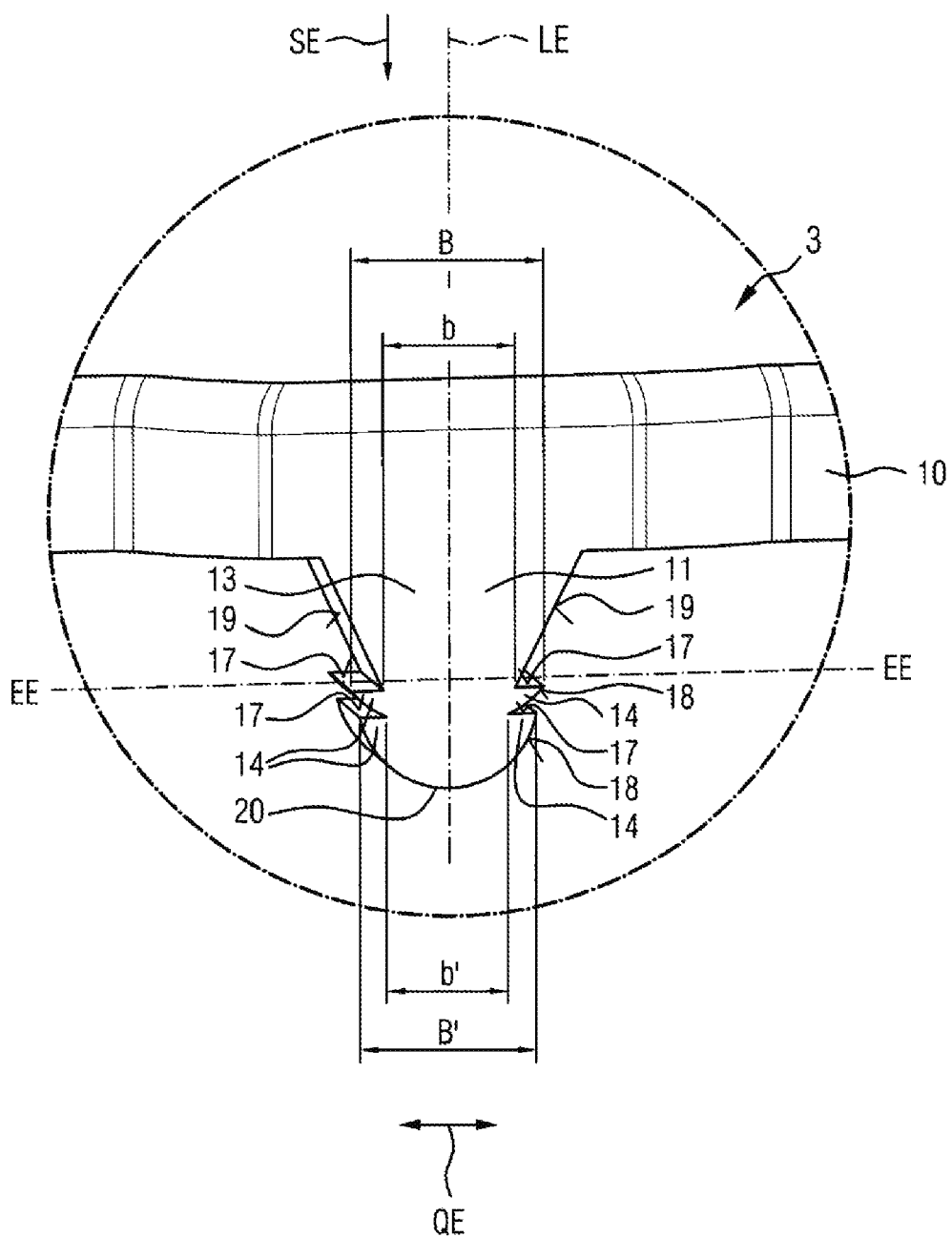
FIG. 3 shows an enlarged view of detail III from FIG. 1.
Figure 4:
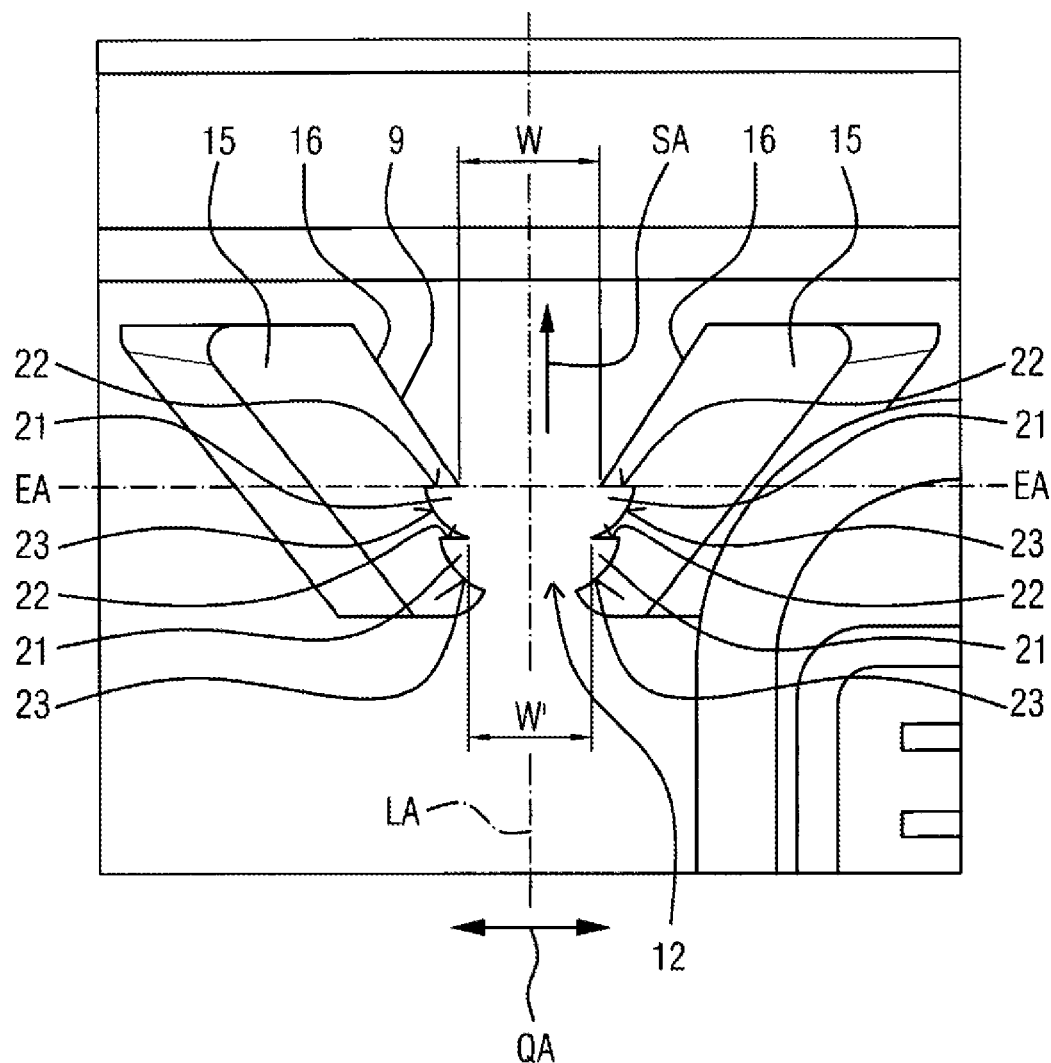
FIG. 4 shows an enlarged plan view of detail IV from FIG. 1.

FIG. 4 shows, on an enlarged scale, that each insertion receptacle 9 has two wall regions 15 which delimit a receiving opening 12, which extends along a receptacle plug-in direction SA of the insertion receptacle 9, on two opposite sides. FIGS. 3 and 4 show, in the form of details, a state in which the plug 2 and the cover 3 are not fitted to one another. In this state, in the cross-sectional plane designated EA in FIG. 4, a clear opening width W between the two regions 15 is smaller than a width, designated B in FIG. 3, of the insertion element 11 in a cross-sectional plane EE which is perpendicular in relation to the element plug-in direction SE and runs through two holding projections 14 at their widest point. In FIG. 4, LA designates a longitudinal center axis of the insertion receptacle 9, SA designates a receptacle plug-in direction which is parallel in relation to said longitudinal center axis and points in the direction of the arrow, and QA designates a receptacle transverse direction which is oriented perpendicular in relation to said receptacle plug-in direction and is an absolute figure.

Figure 5:
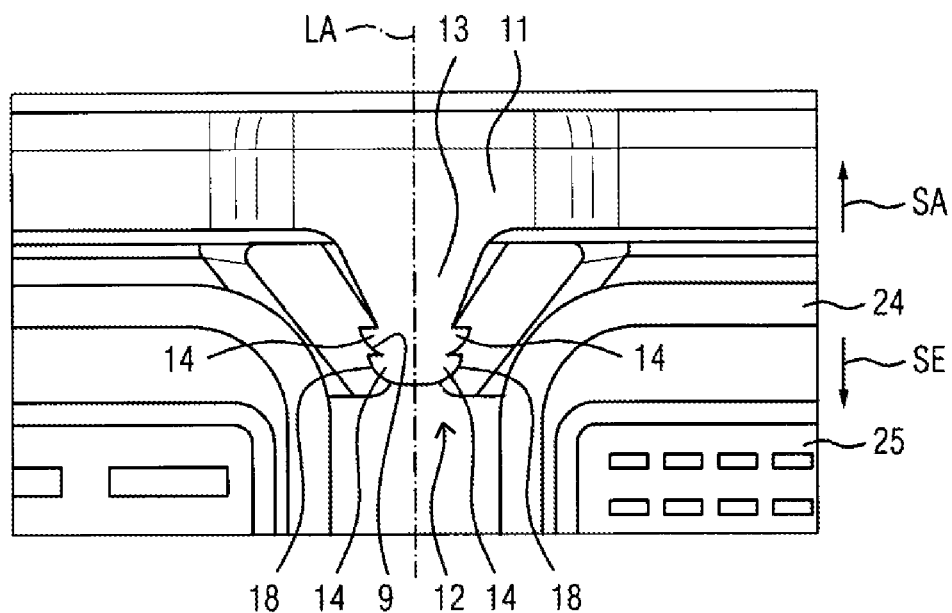
FIG. 5 shows an enlarged plan view of detail V from FIG. 2.

Proceeding from the situation shown in FIGS. 3 and 4, the insertion element 11 and the receiving opening 12 can be moved toward one another in the element plug-in direction SE and, respectively, in the receptacle plug-in direction SA until the interlocking snap-action connection shown in FIG. 5 is produced, this preventing the insertion element 11 from being pulled out of the receiving opening 12.

In the example, in each case two holding projections 14 of the four holding projections 14 on the insertion element 11 are arranged next to one another in the same axial position in relation to one another, so that they are regarded as being a pair in each case. Each holding projection 14 has, in a cross-sectional plane which is parallel in relation to the element plug-in direction SE and in relation to the element transverse direction QE, a holding face 17 which runs perpendicularly in relation to the element plug-in direction and extends outward at an angle from a shaft side face 19. A side face 18 of the holding projection 14 adjoins each holding face 17 at an angle thereto and, in the example, runs in a slightly rounded manner in the direction of a free longitudinal end 20 of the insertion element 11 and in the direction of the longitudinal center axis LE of the insertion element 11. Two holding projections 14 which belong to one pair share an arrow-shaped outer contour. In this case, the two holding projections 14 of a respective pair are designed axially symmetrically in relation to one another with respect to the longitudinal center axis LE. FIG. 3 shows that, in the case of the pair which is further remote from the rounded longitudinal end 20, the holding faces 17 extend outward to such an extent that the insertion element 11 has a width B there, while the width B' correspondingly determined at the second pair, which is closer to the longitudinal end 20, is somewhat smaller than the width B.

The receiving opening 12 has, at its longitudinal end which faces the cover 3, a mouth 16. From there, the two wall regions 15 approach one another in the direction opposite to the receptacle plug-in direction SA. The substantially triangular cross-sectional profile formed in this way is matched geometrically to the receptacle of the longitudinal section of the shaft 13 that is situated above the holding projections 14 in FIG. 3. FIG. 4 shows that two recesses 21, which lie one behind the other with respect to the receptacle plug-in direction SA, are formed on each wall region 15. In each case two recesses 21 are designed axially symmetrically with respect to the longitudinal center axis LA and form a pair. Each recess 21 forms a supporting face 22 which runs perpendicularly in relation to the longitudinal center axis LA and also aside face 23 which adjoins said supporting face at an angle and, proceeding from the supporting face 22, runs in the direction away from the insertion mouth 16 and in the direction of the longitudinal center axis LA of the receiving opening 12. Therefore, in each case two recesses 21, which form a pair, share an arrow-shaped outer contour.

In the exemplary embodiment described, the pair of recesses 21 which is at the top in FIG. 4 is associated with the pair of holding projections 14 which is at the top in FIG. 3 for the interlocking engagement of said pair of holding projections on the insertion receptacle 9. In this case, the contour which is formed on these holding projections 14 by the holding face 17 and the side face 18 substantially corresponds, in the example, to the contour which is formed on the two said recesses 21 by the supporting faces 22 and side faces 23 thereof. Since a width B, which is the maximum occurring width of the insertion element 11 in the region of the two holding projections which form the top pair, is somewhat greater than the clear width W in FIG. 4, which clear width is the opening width W which is delimited by the two supporting faces 22, the movement resistance increases during insertion. If the insertion force is increased until this resistance is overcome, this leads, in the example shown, to an elastic increase in the size of the clear opening width W at the wall regions 15, so that the two holding projections 14 pass the elastically widened narrow point. Then, the wall regions 15 undergo elastic return deformation, and the holding projections 14 extend into the recesses 21 which are formed in the wall regions 15 and are intended to receive said holding projections. In this respect, this is an elastic snap-action connection which creates an interlocking connection against the insertion direction. In the selected exemplary embodiment, two pairs of holding projections 14 and recesses 21 are provided in each case, as already discussed. In this case, the pair of holding projections 14 which is close to the longitudinal end 20 in FIG. 3 interacts in a corresponding manner with the pair of recesses 21 which is further remote from the mouth 16 in FIG. 4, that is to say as described above with respect to the two respectively other pairs. In the assembled state, cf. FIG. 5, this results in a double or two-stage interlocking connection, as a result of which the axial holding force of the plug-in connection can be increased. With respect to the two further abovementioned pairs, a width B' can be greater than a clear opening width W'. The width B could correspond to the width B' or, for example, be somewhat greater. Accordingly, the clear opening width W could correspond to the clear opening width W' or be somewhat greater. A width b of the shaft 13 in a cross-sectional plane in which the holding faces 17 of the top pair of holding projections 14 extend can correspond to the clear opening width W or be somewhat smaller. The same can be said for the width b' and the clear opening width W'.

FIG. 1 illustrates that, in the case of the orientation of the cover 3 relative to the plug 2 perspectively shown there and intended for fitting the cover 3 to the plug 2, each insertion element 11 is in alignment with a receiving opening 12 which is intended to receive said insertion element.

In the case of the exemplary embodiment selected in FIGS. 1 to 5, the plug 2 has a plurality of plug-in frames 24, each of which borders a plug chamber 25 in which the free longitudinal ends of the contact pins 7 are situated. Each plug-in frame 24 is fastened to the end face 6 of the plug main body 5 and extends away from there in the direction in which the contact pins 7 also extend in the direction of their free longitudinal ends. From amongst the three insertion receptacles 9 present, in each case one is located between one of the two longitudinal ends of the plug housing 4 and the plug-in frame 24 which is closest to said longitudinal end. The third insertion receptacle 9 is arranged between the two central plug-in frames 24 with respect to the plug longitudinal direction LS.

FIG. 1 schematically indicates that a curable sealing material 26 is arranged between the cover longitudinal edge 10 and the plug longitudinal edge 8 for mutually sealing off said edges. Said sealing material is introduced as a sealing compound into a sealing groove 27 which extends in the top side of the plug longitudinal edge 8, said top side facing the cover 3, and which, as schematically indicated in FIG. 1, can also continue into adjoining edge sections of the plug housing 4. In the example, the plug 2 is a plug 2 of a motor controller, which is not jointly illustrated in the figures. The cover 3 and the plug housing 4 can be supplemented by means of further housing parts to form a housing which is closed from all sides and in which the motor controller can be arranged.

Figure 2:
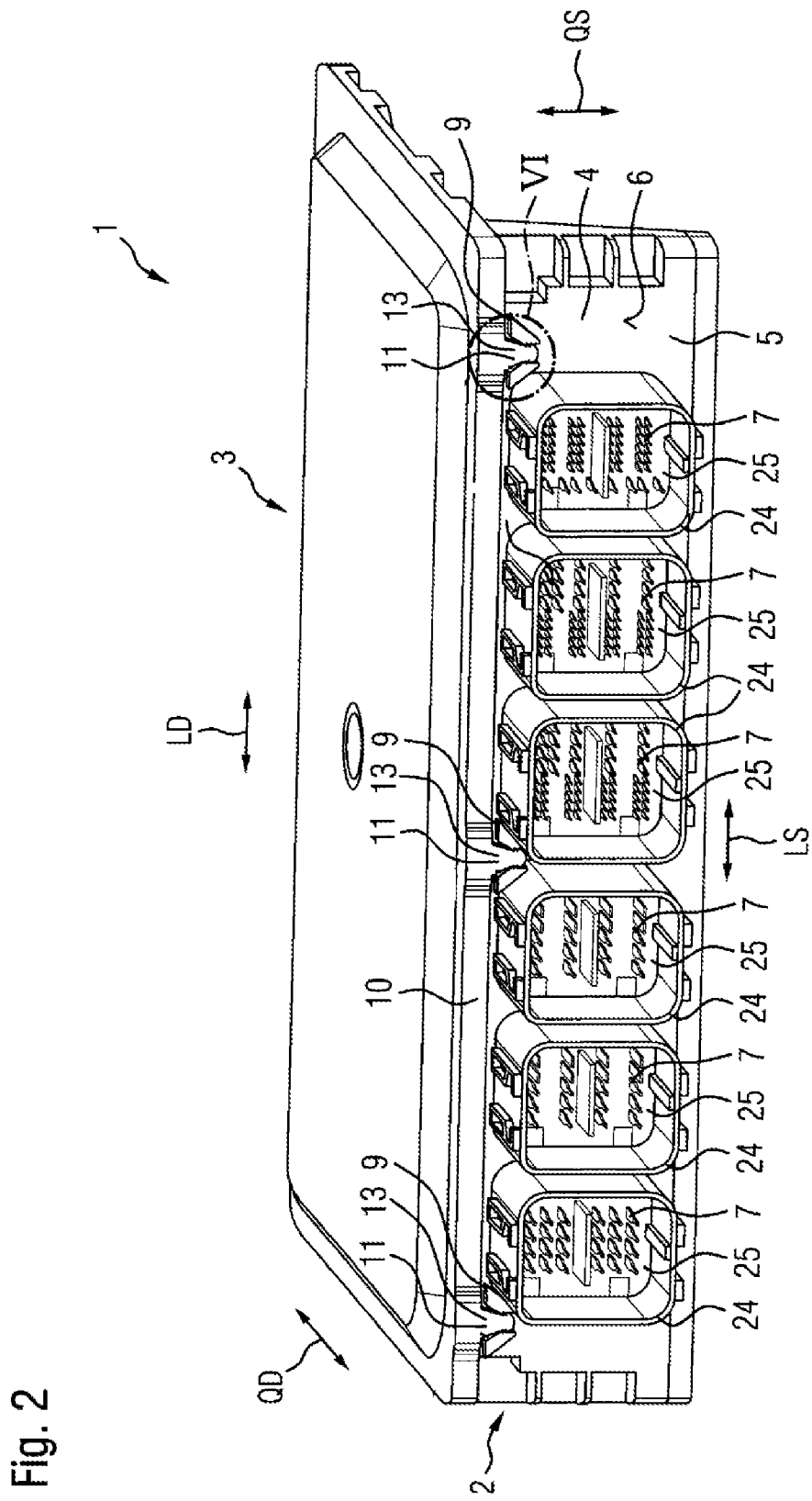
FIG. 2 shows the combination shown in FIG. 1 in the assembled state.
Figure 6:
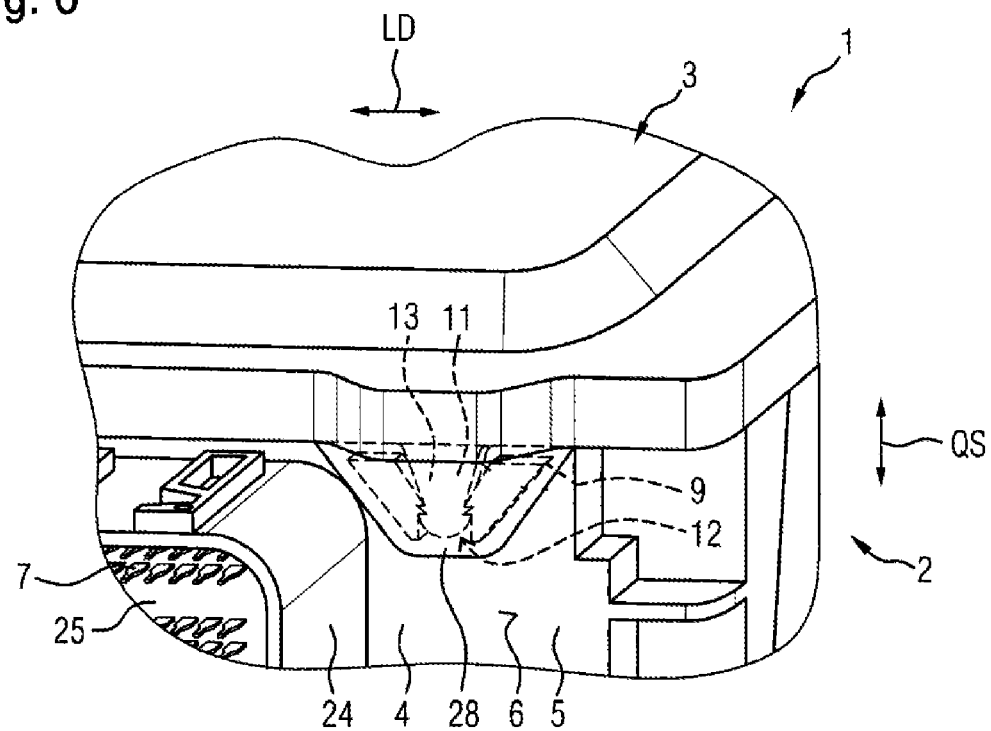
FIG. 6 shows an enlarged plan view of a modification of detail VI from FIG. 2.

A configuration of the insertion receptacle 9 in which the receiving opening 12 is open in the viewing direction of FIGS. 1 and 2, that is to say at the front, is selected by way of example in FIGS. 1 to 5. As an alternative, FIG. 6 shows, using an illustration of a detail, hidden edges, illustrated using dashed lines in this respect, that the receiving opening 12 can be covered by means of a cover 28 which is integrally formed, for example, on the wall regions 15 and of which the inner face preferably extends parallel and at a distance from the end face 6.

Figure 4A:
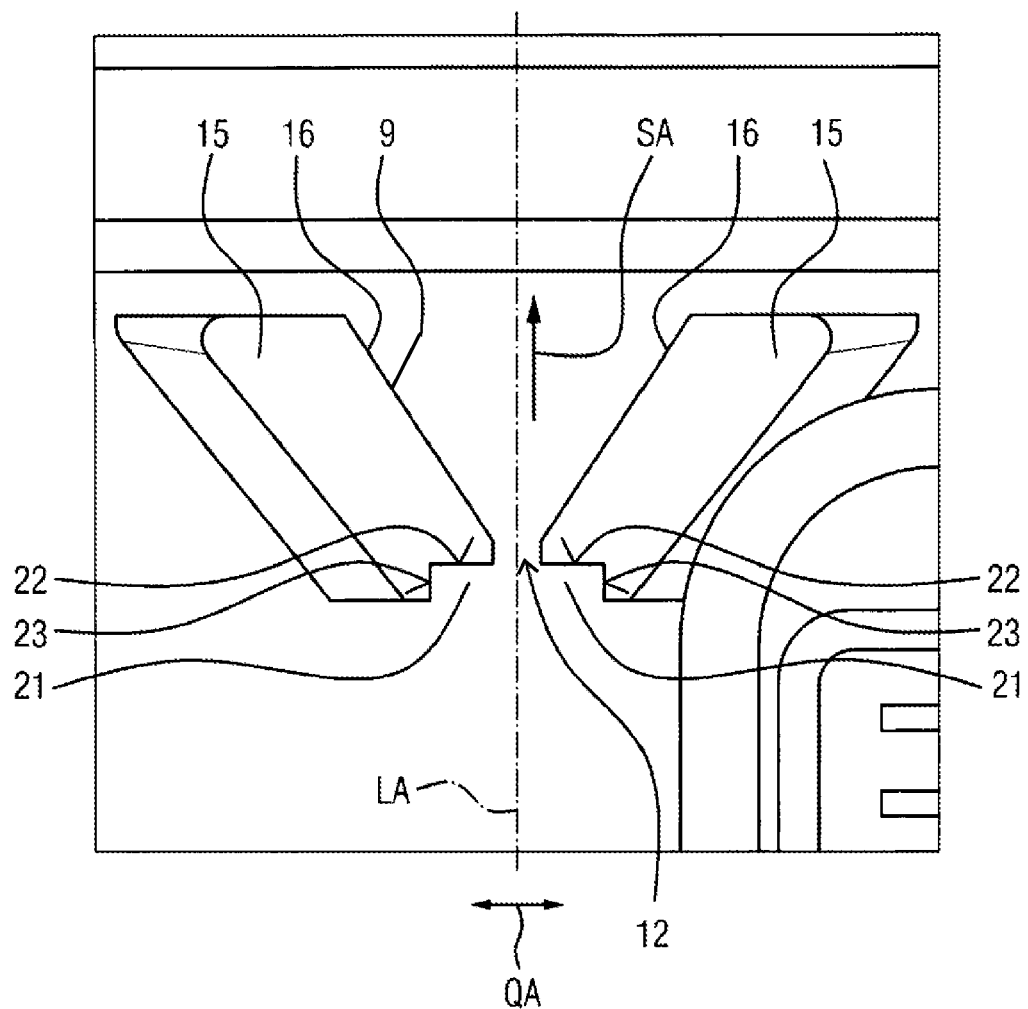
FIG. 4a shows an embodiment which is modified in relation to FIG. 4.

FIG. 4a shows a modified embodiment of the wall regions 15. In a departure from the exemplary embodiment shown in FIG. 4, there are no recesses 21 formed in the wall regions 15 before an insertion element 11 is inserted in said FIG. 4a, but rather the opening 12 also tapers with a smooth surface in the regions in which the recesses 21 are situated in FIG. 4. In the embodiment shown in FIG. 4a, the wall regions 15 can be formed, for example, from a softer material than the insertion element 11. When the insertion element 11 is inserted into the receiving opening 12, recesses can be elastically and/or plastically formed in the wall regions 15, said recesses likewise creating an interlocking connection which acts against the insertion direction of the insertion element.

The invention is not restricted to the exemplary embodiments by the description thereof. Instead, the invention comprises each new feature and each combination of features, which contains, in particular, each combination of features in the exemplary embodiments and patent claims.

The invention claimed is:

1. A combination, comprising:
a plug having a plug housing, said plug housing having a plug main body with a planar end face, and contact pins protruding from and beyond said planar end face of said plug main body, said plug having a plug-in frame attached to said end face of said plug main body, said plug-in frame bordering a plug chamber into which said contact pins extend;
said plug housing extending in a plug longitudinal direction and in a plug transverse direction, which is perpendicular to said plug longitudinal direction, and having a plug longitudinal edge that extends along said plug longitudinal direction, and having at least one insertion receptacle disposed on said planar end face and bordering a receiving opening, said insertion receptacle being arranged adjacent said plug-in frame as viewed in said plug longitudinal direction;
a cover extending in a cover longitudinal direction and in a cover transverse direction, which is perpendicular to said cover longitudinal direction, and having a cover longitudinal edge that extends along said cover longitudinal direction, and having at least one insertion element formed on, or adjacent to, said cover longitudinal edge and configured for insertion into said receiving opening, said insertion element extending transversely to said cover longitudinal direction and to said cover transverse direction;
said insertion element having a shaft, which extends along an element plug-in direction of said insertion element, and at least one holding projection, which proceeds from said shaft in an element transverse direction that is perpendicular to the element plug-in direction;
said insertion receptacle having two wall regions delimiting said receiving opening, which extends along a receptacle plug-in direction of said insertion receptacle, on two mutually opposite sides; and
wherein, in a non-assembled state of said plug and said cover, an opening width between said two wall regions in at least one cross-sectional plane that is perpendicular to said receptacle plug-in direction, is smaller than a width of said insertion element in at least one cross-sectional plane that is perpendicular in relation to the element plug-in direction and that runs through said holding projection.

2. The combination according to claim 1, wherein said insertion element extends perpendicularly to said cover longitudinal direction and perpendicularly to said cover transverse direction.

3. The combination according to claim 1, wherein said insertion element is configured for insertion into said receiving opening such that an interlocking connection is produced between said holding projection and at least one of said wall regions which prevents said insertion element from being pulled out of said receiving opening.

4. The combination according to claim 3, wherein said interlocking connection is interlocking snap-action connection.

5. The combination according to claim 1, wherein, in a cross-sectional plane which runs parallel in relation to said element plug-in direction, each said holding projection has a holding face which runs transversely in relation to said element plug-in direction, and a side face, which adjoins said holding face at an angle and which, proceeding from said holding face, runs in the direction of a free longitudinal end of said insertion element.

6. The combination according to claim 5, wherein said side face runs straight or rounded from said holding face towards the free longitudinal end of said insertion element.

7. The combination according to claim 1, wherein said at least one holding projection is a pair of two holding projections next to one another which face outward from said shaft to opposite sides, or said at least one holding projection is a plurality of pairs of two holding projections next to one another which face outward from said shaft to opposite sides, and said two holding projections of a respective pair are formed axially symmetrically in relation to one another with respect to the longitudinal center axis of said insertion element.

8. The combination according to claim 7, wherein a first pair formed of two holding projections is arranged farther away from a free longitudinal end of said insertion element than a second pair formed of two holding projections, said holding faces of said first pair extend outward until they are farther away from the longitudinal center axis of said insertion element than said holding faces of said holding projections of said second pair.

9. The combination according to claim 1, wherein one or both of the following is true:
in a cross-sectional plane parallel to said element plug-in direction, each of two recesses which are formed next to one another has an outer contour which corresponds to the outer contour of two holding projections, which are arranged next to one another, in a cross-sectional plane that is parallel to the receptacle plug-in direction;
when said cover is oriented relative to said plug in an intended orientation for fitting said cover to said plug, said insertion element is in alignment with said receiving opening.

10. The combination according to claim 1, wherein:
said at least one insertion element is one of a plurality of insertion elements arranged on, or adjacent to, said cover longitudinal edge and spaced apart at a spacing distance from one another in the cover longitudinal direction; and
said at least one insertion receptacle is one of a plurality of insertion receptacles arranged on, or adjacent to, said plug longitudinal edge and spaced apart at a spacing distance from one another in the plug longitudinal direction; and
when said cover is oriented relative to said plug in an intended orientation for fitting said cover to said plug, each of said insertion elements is in alignment with a receiving opening of a respective said insertion receptacle.

11. The combination according to claim 1, wherein said insertion elements and associated insertion receptacles include further insertion elements and insertion receptacles that are arranged farther outward in said plug longitudinal direction and, respectively, in said cover longitudinal direction, and that have further holding projections and further recesses matched to one another such that, in the assembled state, a smaller overlap between supporting faces and holding faces results than in the case of at least one insertion element and one associated insertion receptacle which are arranged further centrally in the plug longitudinal direction and, respectively, in the cover longitudinal direction, and wherein, in the assembled state of said cover and said plug, an overlap between at least one holding face and one supporting face is produced only on one side of said longitudinal center axis of said insertion element on the two respectively outermost insertion elements and insertion receptacles.

12. The combination according to claim 1, further comprising a sealing material disposed between said cover longitudinal edge and said plug longitudinal edge for sealing purposes.

13. The combination according to claim 12, wherein said sealing material is curable or cured sealing material.

14. The combination according to claim 1, wherein at least one of the following is true: said plug is a plug of an electronic control unit, said cover is a sheet-metal cover, and/or said cover is a cover or a base of a housing for an electronic control unit.

15. The combination according to claim 14, wherein said electronic control unit is a motor controller.

16. A combination, comprising:
a plug having a plug housing, said plug housing having a plug main body with an end face, and contact pins protruding beyond said end face of said plug main body;
said plug housing extending in a plug longitudinal direction and in a plug transverse direction, which is perpendicular to said plug longitudinal direction, and having a plug longitudinal edge that extends along said plug longitudinal direction, and having at least one insertion receptacle formed in, or adjacent to, said plug longitudinal edge and bordering a receiving opening;
a cover extending in a cover longitudinal direction and in a cover transverse direction, which is perpendicular to said cover longitudinal direction, and having a cover longitudinal edge that extends along said cover longitudinal direction, and having at least one insertion element formed on, or adjacent to, said cover longitudinal edge and configured for insertion into said receiving opening, said insertion element extending transversely to said cover longitudinal direction and to said cover transverse direction;
said insertion element having a shaft, which extends along an element plug-in direction of said insertion element, and at least one holding projection, which proceeds from said shaft in an element transverse direction that is perpendicular to the element plug-in direction;

said insertion receptacle having two wall regions delimiting said receiving opening, which extends along a receptacle plug-in direction of said insertion receptacle, on two mutually opposite sides; and wherein, in a non-assembled state of said plug and said cover, an opening width between said two wall regions in at least one cross-sectional plane that is perpendicular to said receptacle plug-in direction, is smaller than a width of said insertion element in at least one cross-sectional plane that is perpendicular in relation to the element plug-in direction and that runs through said holding projection in each case one recess or a plurality of recesses being formed in said two wall regions that border said receiving opening, in a cross-sectional plane which runs parallel to said receptacle plug-in direction, said recess or each said recess having a supporting face extending transversely relative to said receptacle plug-in direction and a side face which adjoins said supporting face at an angle and which, proceeding from said supporting face, runs in the direction away from an insertion mouth of the receiving opening and in the direction of a longitudinal center axis of the receiving opening.

17. A combination, comprising:
a plug having a plug housing, said plug housing having a plug main body with an end face, and contact pins protruding beyond said end face of said plug main body;
said plug housing extending in a plug longitudinal direction and in a plug transverse direction, which is perpendicular to said plug longitudinal direction, and having a plug longitudinal edge that extends along said plug longitudinal direction, and having at least one insertion receptacle formed in, or adjacent to, said plug longitudinal edge and bordering a receiving opening;
a cover extending in a cover longitudinal direction and in a cover transverse direction, which is perpendicular to said cover longitudinal direction, and having a cover longitudinal edge that extends along said cover longitudinal direction, and having at least one insertion element formed on, or adjacent to, said cover longitudinal edge and configured for insertion into said receiving opening, said insertion element extending transversely to said cover longitudinal direction and to said cover transverse direction;
said insertion element having a shaft, which extends along an element plug-in direction of said insertion element, and at least one holding projection, which proceeds from said shaft in an element transverse direction that is perpendicular to the element plug-in direction;
said insertion receptacle having two wall regions delimiting said receiving opening, which extends along a receptacle plug-in direction of said insertion receptacle, on two mutually opposite sides, said insertion receptacle being formed with a pair of two recesses next to one another extending outward in opposite lateral directions, or said insertion receptacle having a plurality of pairs each having two recesses next to one another extending outward in opposite directions and said two recesses of a respective said pair being formed axially symmetrically in relation to one another with respect to a longitudinal center axis of said insertion receptacle; and wherein, in a non-assembled state of said plug and said cover, an opening width between said two wall regions in at least one cross-sectional plane that is perpendicular to said receptacle plug-in direction, is smaller than a width of said insertion element in at least one cross-sectional plane that is perpendicular in relation to the element plug-in direction and that runs through said holding projection.

18. The combination according to claim 17, wherein, for one of said pairs that is formed from two recesses, a clear opening width, which is determined by said two supporting faces of said one pair, is smaller than, for at least one pair that is formed from two holding projections, a width of said insertion element which is determined by said two holding faces of said pair.

19. The combination according to claim 17, wherein,
with said plug and said cover in an assembled state, two holding projections of one pair engage into a pair of recesses, and a width of said insertion element in a region of said two holding projections is greater than a clear opening width of said receiving opening in a region which immediately precedes the recesses; and
one or both of the following is true:
said insertion element is dimensioned and configured such that said two holding projections of said pair, when said insertion element is inserted into said receiving opening, are moved through the cross section of said receiving opening with the clear opening width and are elastically deformed, so that a reduction in the width of said insertion element results;
or, alternatively or in addition, at least one of said wall regions of said insertion receptacle is dimensioned and configured such that it is elastically deformed and/or shifted, so that an increase in size of the clear opening width results due to said two holding projections of said pair, when said insertion element is inserted into said receiving opening, being moved through the cross section of said receiving opening with the clear opening width.

* * * * *